United States Patent
Ham et al.

(10) Patent No.: US 6,679,194 B2
(45) Date of Patent: Jan. 20, 2004

(54) CASSETTE TABLE OF A SEMICONDUCTOR FABRICATING APPARATUS

(75) Inventors: Dong-Seok Ham, Kyunggi-do (KR); Kun-Hyung Lee, Kyunggi-do (KR); Hyeogi-Ki Kim, Seoul (KR); Kyoung-Ho Park, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/265,693

(22) Filed: Oct. 8, 2002

(65) Prior Publication Data

US 2003/0089313 A1 May 15, 2003

(30) Foreign Application Priority Data

Nov. 8, 2001 (KR) .......................................... 2001-69426

(51) Int. Cl.⁷ ............................................... B05C 13/02
(52) U.S. Cl. ....................... 118/500; 414/937; 414/940; 211/41.18; 206/710; 206/711
(58) Field of Search ................... 118/52, 500; 427/240, 427/289, 425; 414/937, 940; 211/41.18; 206/454, 710, 711

(56) References Cited

U.S. PATENT DOCUMENTS

| | | | | |
|---|---|---|---|---|
| 5,383,783 A | * | 1/1995 | Ishimori | 432/253 |
| 5,964,344 A | * | 10/1999 | Hatada | 206/205 |
| 6,039,186 A | * | 3/2000 | Bhatt et al. | 206/711 |
| 6,099,242 A | * | 8/2000 | Hong et al. | 414/788.6 |

* cited by examiner

Primary Examiner—Richard Crispino
Assistant Examiner—Michelle A. Lazor
(74) Attorney, Agent, or Firm—Volentine Francos, PLLC

(57) ABSTRACT

A cassette table on which a wafer cassette is supported allows static electricity to be discharged from the cassette and hence, form the wafers disposed in the cassette. The cassette table includes a top plate, a cassette supporter that is mounted on the top plate and supports the cassette. At least part of the cassette supporter is made of a material that allows static electricity to be discharged to ground therethrough.

6 Claims, 7 Drawing Sheets

CASSETTE TABLE OF A SEMICONDUCTOR FABRICATING APPARATUS

BACKGROUND OF THE INVENTION

1. Field of the Invention

The present invention relates to a semiconductor fabricating apparatus. More particularly, the present invention relates to a cassette table for supporting a wafer cassette outside a processing chamber.

2. Description of the Related Art

In a semiconductor fabricating system, a spinner or a scrubber rapidly rotates a wafer that is being processed. Static electricity occurs on the fast-rotating wafer due to friction between the wafer and air or de-ionized water (DI water). When the wafer is charged with static electricity, large numbers of particles will electro-statically adhere to the wafer. Also, arcing occurs during wafer handling. The arcing can damage wiring patterns or metal lines of the wafer. In particular, the larger the wafer is, the greater the static electricity affects the wafer in these ways.

These problems are exacerbated by a conventional cassette table having non-conductive cassette supporters, as shown in FIG. 1. After a spinner or a scrubber rotates a wafer in carrying out a coating or a cleaning process, the wafer charged with static electricity by the process is transferred to a wafer cassette. Wafer support pins and wafer-contacting parts of the wafer transfer device (not shown) are made of urethane or another soft non-conducting material in order to avoid scratching the wafer. Therefore, the static electricity accumulated on the wafer is not discharged through the wafer transfer device and the support pins. The cassette 20 into which the charged wafer is loaded is disposed on a cassette table 10. As wafers are sequentially loaded into the cassette 20, the amount of static electricity applied to the cassette 20 increases.

The cassette 20 is made of a static dissipative material. Thus, the cassette 20 could discharge static electricity to a grounded conductor. However, although the cassette table 10 includes a top plate 12 of a conductive material, the cassette table 10 also includes a cassette supporter 14 of a non-conductive material. The cassette supporter 14 comprises one or more guide blocks 18 for positioning the cassette 20 on the table 10, and one or more pads 16 on which the cassette 20 sits. The static electricity accumulated on the cassette 20 is not discharged through the grounded top plate 12 because the cassette supporter 14 is entirely non-conductive.

The guide blocks 18 and the pads 16 are necessary components of the cassette table 10 in a semiconductor fabricating system. The guide blocks 18 position the cassette 20 relative to a downstream wafer transfer device and suppress the mobility of the cassette 20. The pads 16 alleviate the shock that the cassette 20 would otherwise experience while disposed on the top plate 12 of the cassette table 10.

The guide blocks 18 and the pads 16 must be made of soft materials such as non-conductive Teflon to alleviate shock and prevent the cassette 20 from being scratched and abraded. If the cassette supporter 14 were made of a conductive material, the static electricity accumulated on the cassette 20 would readily discharge to the top plate 12. However, friction between the cassette 20 and the hard material of the cassette supporter 14 would scratch or abrade the cassette 20. Such abrasions and scratches could cause the cassette 20 to deviate from its predetermined position on the cassette supporter 14. Such deviation could result in a collision between a blade and of the wafer transfer device and a wafer when the wafer transfer device picks the wafer from the cassette 20.

FIG. 2 illustrates wafers to which particles adhere during processing. More particularly, FIG. 2(a) shows a wafer form which static electricity has been discharged, whereas FIG. 2(b) shows a wafer charged with static electricity. As the figures show, many more particles adhere to a wafer charged with static electricity than to a wafer from which static electricity has been discharged. This unfavorable phenomenon is more pronounced in wafers having large diameters.

FIG. 3 illustrates a portion of a wafer on which metal lines are formed. When a wafer charged with the static electricity is handled, arcs are created and the arcs damage portions (a) of the metal lines of the wafer. A wafer having damaged portions (a) of its metal lines will be rejected during an inspection process. Thus, arcing as the result of static electricity accumulated on a wafer lowers the manufacturing yield.

Still further, the static electricity accumulated on the cassette generates electrical interference in the semiconductor fabricating system. The electric interference causes the semiconductor fabricating system to malfunction.

SUMMARY OF THE INVENTION

One object of the present invention is to provide a cassette table of a semiconductor fabricating apparatus that allows static electricity to discharge from a cassette.

Another object of the present invention is to provide a cassette table that allows static electricity to discharge from a cassette without scratching or abrading the cassette.

A cassette table according to the present invention includes a top table, and a cassette supporter that is mounted on the top plate and supports a cassette above the top table, the cassette supporter including discharge means for discharging static electricity from the cassette.

The cassette supporter has one or more guide blocks for guiding the cassette into a predetermined position on the top plate, and one or more conductive pads on which the cassette rests.

In one embodiment, the guide blocks for guiding the cassette to a predetermined position on the top plate and the pads on which the cassette is located are electrically non-conductive members. The discharge means is disposed on at least one of the guide block(s) and the pad(s).

The top plate is grounded, and the discharge means electrically connects the cassette to the top plate. Preferably, the discharge means is a conductive cover for covering at least one of the non-conductive guide block(s) and the non-conductive pad(s). The cover may be made of a material consisting of 70 wt. % polyether ether ketone (PEEK) and 30 wt. % carbon fibers.

In another embodiment, the cassette table includes a top plate and a cassette supporter consisting of a soft electrically conductive material. In this case, therefore, the guide blocks and the pads of the cassette supporter are of the soft electrically conductive material. Preferably, the material is a combination of 70 wt. % polyether ether ketone (PEEK) and 30 wt. % carbon fibers. Again, the top plate is grounded, and the cassette supporter is mounted upon the top plate so as to allow static electricity to be discharged from the cassette.

DETAILED ESCRIPTION OF THE PREFERRED EMBODIMENTS

Figure 1:
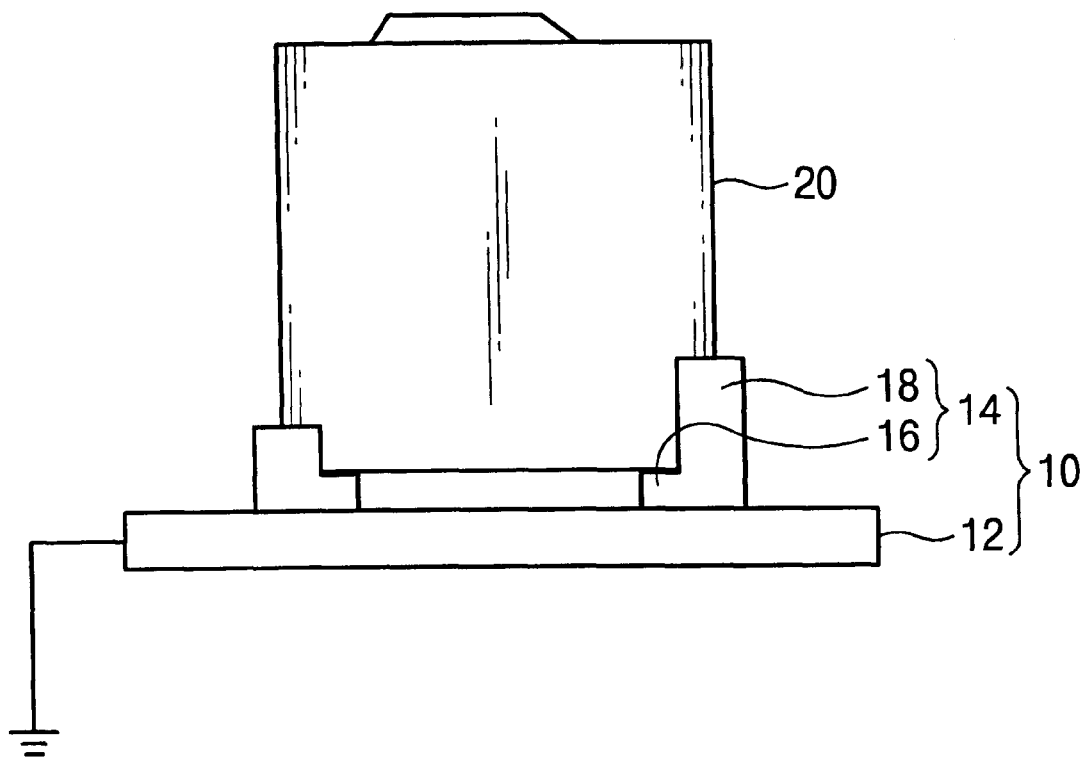
FIG. 1 is a side view of a conventional cassette table on which a cassette is supported.
Figure 2A:
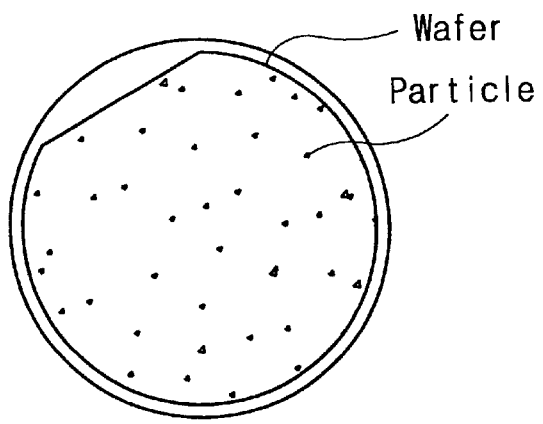
FIG. 2(a) is a plan view of a wafer from which static electricity has been discharged during the course of its being transferred between processes.
Figure 2B:
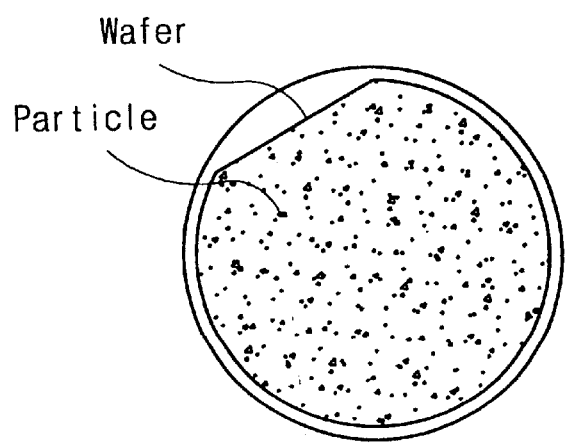
FIG. 2(b) is a plan view of a wafer on which static electricity has accumulated during the course of its being transferred between processes.
Figure 3:
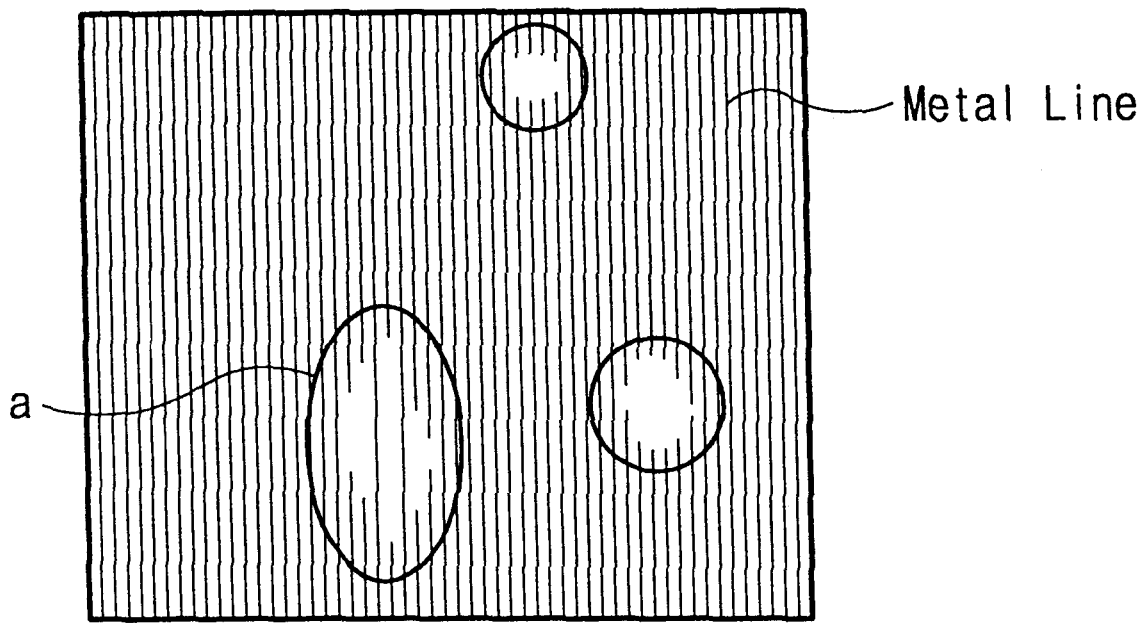
FIG. 3 is a schematic plan view of metal lines of a wafer damaged due to arcs created by static electricity.
Figure 4:
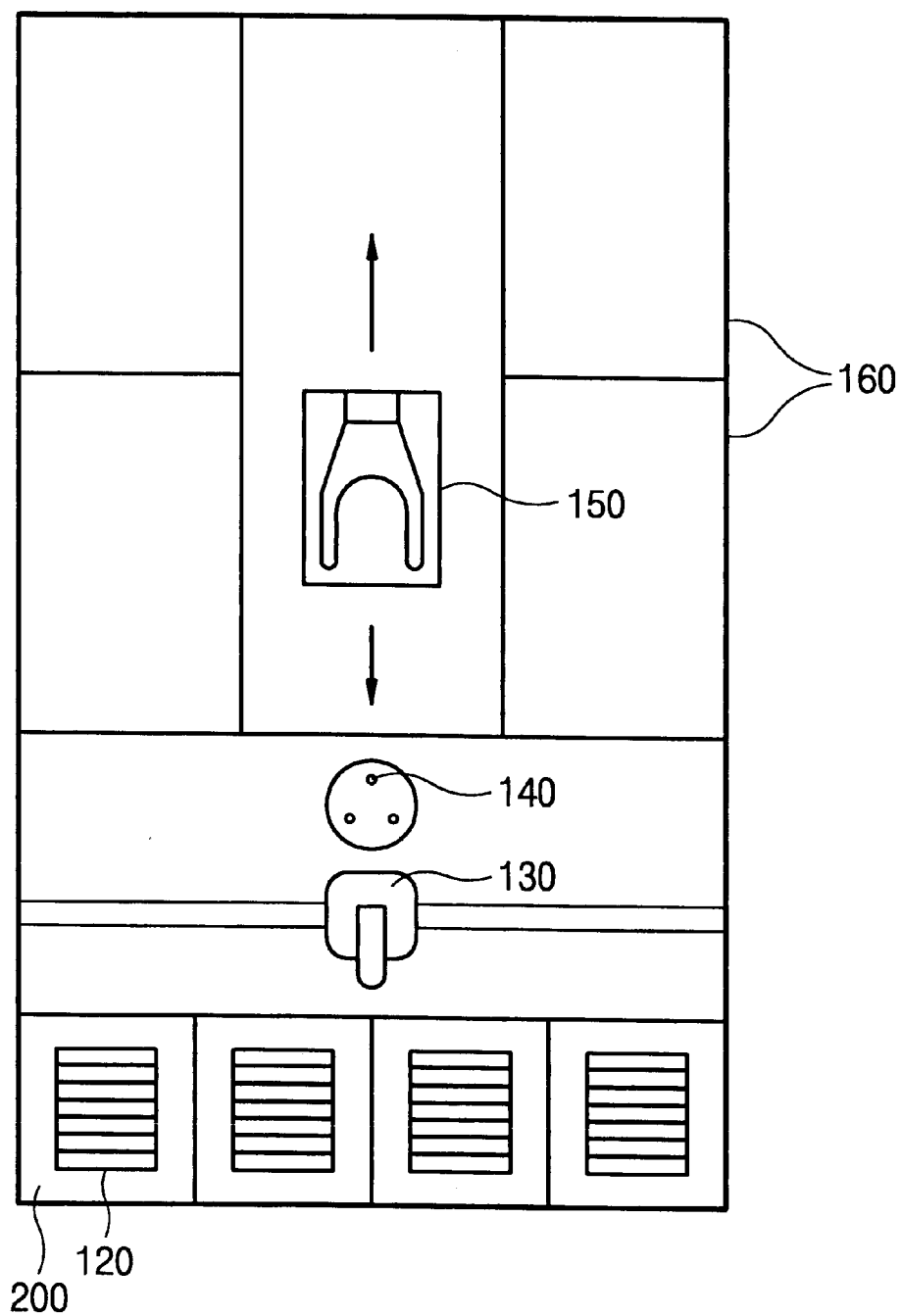
FIG. 4 is a schematic plan view a semiconductor device fabricating apparatus according to the present invention.

Referring to FIG. 4, a spinner 100 includes a cassette table 200, a first transfer device 130, support pins 140, a second transfer device 150, and processing chambers 160 in which turntables for facilitating a spin-coating operation are provided.

A cassette 120 for receiving wafers is located on the cassette table 200. Wafers are transferred from the cassette 120 to the support pins 140 by the first transfer device 130. From there, wafers are processed in the processing chambers 160. More specifically, the wafers are spun rapidly in the processing chambers 160 in order to carry out a coating process. The fast-rotating wafers are thus charged with static electricity. Subsequently, these wafers are returned to the cassette 120 by the second transfer device 150. The first transfer device 130 re-loads the returned wafers into the cassette 120.

Wafer-contacting parts of the first transfer device 130, the second transfer device 150, and the support pins 140 are made of urethane or non-conductive soft material to prevent the wafers from being scratched. Accordingly, static electricity on a wafer is not discharged through these components. Thus, the charged wafer is loaded into the cassette 120 without the static electricity having been discharged therefrom. Thus, static electricity is transferred to the cassette 20. As additional wafers are loaded into the cassette 120, the amount of static electricity transferred to the cassette 120 increases.

Figure 5:
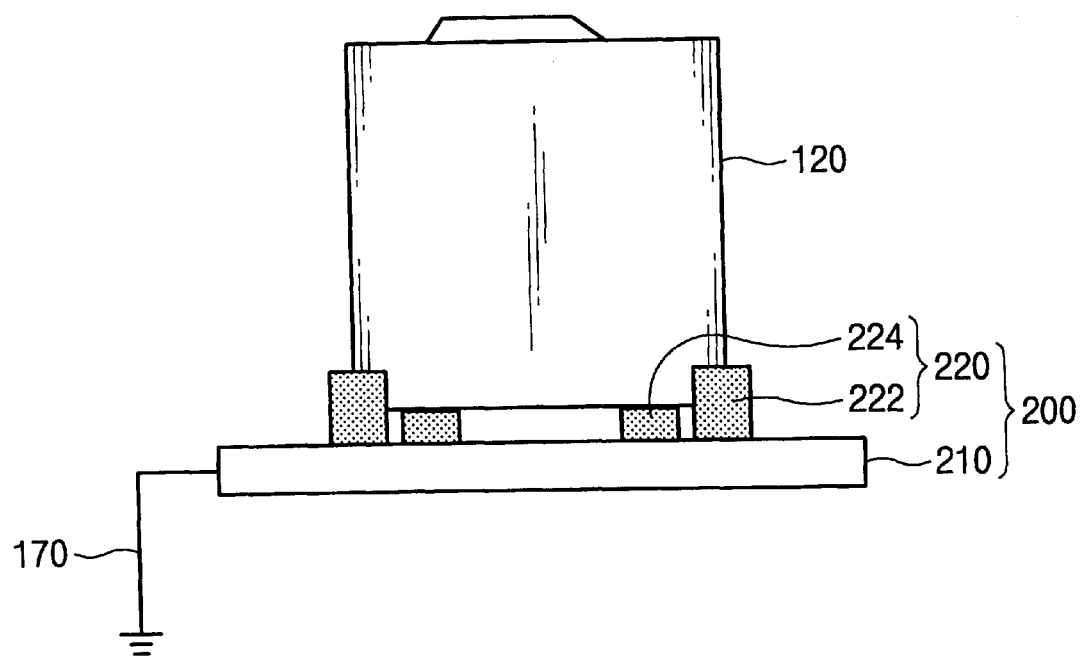
FIG. 5 is a side view of a cassette table according to the present invention.

Referring to FIG. 5, the cassette 120 is made of a conductive material which is 70 wt. % polyether ether ketone (PEEK) and 30 wt. % carbon fibers. The cassette table 200 includes a top plate 210 and a cassette supporter 220. The cassette supporter 220 comprises one or more guide blocks 222 for guiding the cassette 120 to a predetermined position and one or more pads 224 on which the cassette 120 is placed. The guide blocks 222 contact side portions of the bottom of the cassette 120, and the upper surfaces of the pads 224 contact the bottom surface of the cassette. At least one of the guide blocks 222 and the pads 224 is made of conductive material so as to serve as means for discharging static electricity that has accumulated on the cassette 120. Therefore, the static electricity on the cassette 120 flows to the top plate 210 through the cassette supporter 220. A ground line 170 is connected to the top plate 210 so that the static electricity is conducted to ground through the cassette supporter 220 and the top plate 210.

As the conductive material, static dissipative material is preferable to metal which rapidly discharges static electricity. For example, the conductive material is a combination of 70 wt. % polyether ether ketone (PEEK) and 30 wt. % carbon fiber. If metal were used, the static electricity accumulated on the cassette 120 would be discharged very quickly, i.e., a large current would be generated. A large current could produce so much heat that wafers in the cassette 120 could be damaged. Furthermore, a metal cassette supporter would abrade and scratch the cassette 120. Therefore, the cassette supporter 220 is made of a soft conductive material that will alleviate friction and shock.

Figure 6A:
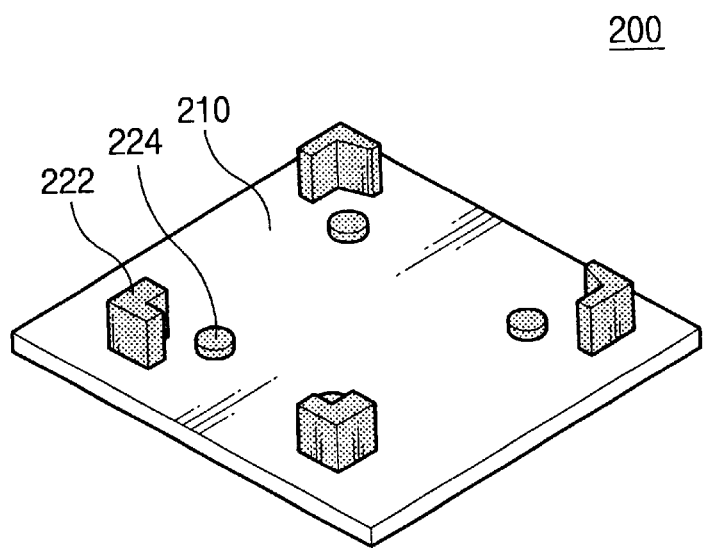
FIG. 6(a) is a perspective view of one type of a cassette supporter of the cassette table according to the present invention.
Figure 6B:
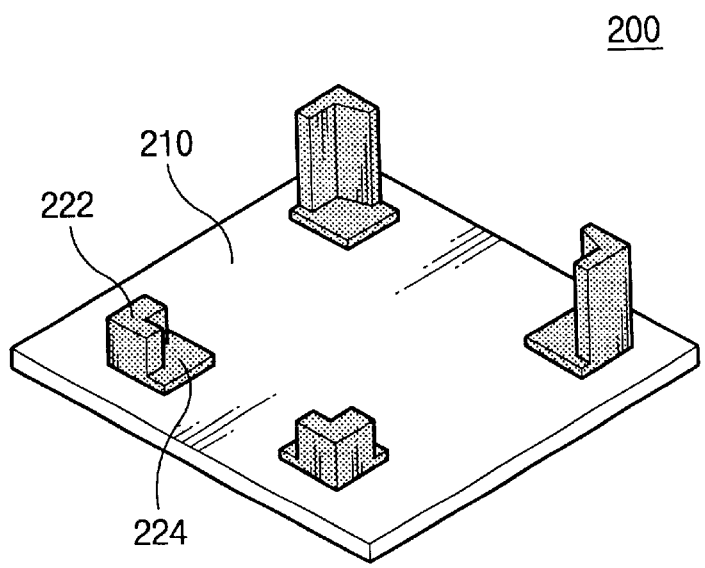
FIG. 6(b) is a perspective view of another type of a cassette supporter of the cassette table according to the present invention.

In the cassette supporter 200 shown in FIG. 6(a), the guide blocks 222 and pads 224 are discrete from each other. On the other hand, in the monolithic type of cassette supporter 200 shown in FIG. 6(b), the guide blocks 222 and pads 224 are unitary.

Figure 7:
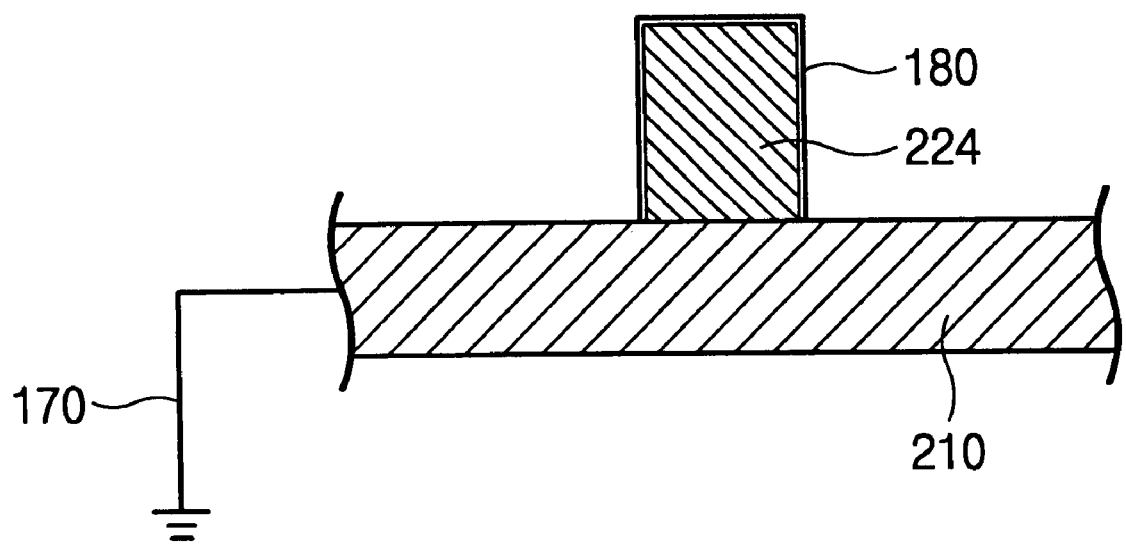
FIG. 7 is a sectional view of a pad of the cassette supporter according to the present invention.

Referring to FIG. 5 through FIG. 7, each pad 224 (and/or guide block 222) may comprise an electrically non-conductive member. A cover 180 made of conductive material covers the pad(s) 224 and/or the guide block(s) 222. The cover 180 thus acts as discharge means for discharging static electricity from the cassette 120. Preferably, the cover 180 comprises a combination of 70 wt. % polyether ether ketone (PEEK) and 30 wt. % carbon fibers or aluminum. The cover 180 is in contact with the top plate 210 so as to be electrically conductively connected thereto. Accordingly, the static electricity flows to the top plate 210 (which is made of conductive material) through the cover 180. Thereafter, the static electricity is discharged to ground from the top plate 210 through the ground line 170. When the conductive cover 180 is used, the cassette supporter 220 does not have to be conductive. Thus, the conductive cover 180 may be simply applied to a conventional non-conductive cassette supporter in order to fabricate a cassette table according to the present invention.

The following "TABLE 1" shows the result of a static electricity discharge test for evaluating the effectiveness of the conductive cover 180. In the test different amounts of static electricity were applied to cassettes set on grounded cassette supporters with and without a cover 180. The voltage values shown in "TABLE 1" are the electrostatic values that an electrostatic meter measured from cassettes.

TABLE 1

|  | cassette 1 | cassette 2 | cassette 3 | cassette 4 | cassette 5 | cassette 6 |
| --- | --- | --- | --- | --- | --- | --- |
| without cover | 30 V | 1140 V | 1620 V | 450 V | 330 V | 290 V |
| with cover | 10 V | 20 V | 10 V | 0 V | 30 V | 150 V |

As shown in "TABLE 1", when the conductive cover 180 is used, static electricity is effectively discharged from the cassette 120.

Although the present invention has been described in connection with the preferred embodiments thereof, the present invention is not so limited. Rather, various alternatives, modifications, and equivalents of the disclosed embodiments are seen to be within the true spirit and scope of the invention as defined by the appended claims.

What is claimed is:

1. A cassette table for supporting a wafer cassette, the cassette table comprising:

a top plate;

a ground connected to said top plate; and a cassette supporter extending upright on and fixed to said top plate, said cassette supporter including at least one guide block having a configuration corresponding to a side portion of the bottom portion of the cassette so as to guide the cassette into position relative to the top plate, at least one pad having an upper surface having a configuration corresponding to a bottom surface portion of the cassette so as to support the cassette, and a cover electrically conductively connected to said top plate, each said at least one guide block and/or said at least one non-conductive pad comprising a member of electrically non-conductive material, and the cover of electrically conductive material covering said at least one electrically non-conductive guide block and/or said at least one electrically non-conductive pad, whereby static electricity will be discharged from a cassette supported and positioned by the cassette supporter.

2. The cassette table, as set forth in claim 1, wherein the electrically conductive cover comprises a combination of polyether ether ketone (PEEK) and carbon fibers.

3. The cassette table, as set forth in claim 2, wherein the combination is 70% PEEK and 30% carbon fiber.

4. A semiconductor device fabricating apparatus, comprising:

a processing chamber;

a wafer cassette;

at least one transfer device that transfers wafers between said processing chamber and said wafer cassette; and a cassette table on which said wafer cassette is disposed, said cassette table comprising an electrically conductive top plate that is connected to ground in the apparatus, and a cassette supporter extending upright on and fixed to said top plate and supporting said wafer cassette above said top plate, said cassette supporter including at least one guide block having a configuration corresponding to a side portion of the bottom portion of the cassette so as to position the cassette relative to the top plate, at least one pad having an upper surface having a configuration corresponding to a bottom surface portion of the cassette so as to support the cassette, and a cover of electrically conductively material connected to said top plate, each said at least one guide block and/or said at least one non-conductive pad comprising a member of electrically non-conductive material, and the cover of electrically conductive material covering said at least one electrically non-conductive guide block and/or said at least one electrically non-conductive pad, whereby static electricity transferred to said cassette is discharged to ground via said cassette supporter and said top plate.

5. The semiconductor fabricating apparatus, as set forth in claim 4, wherein said cover comprises a combination of polyether ether ketone (PEEK) and carbon fibers.

6. The semiconductor fabricating apparatus, as set forth in claim 5, wherein the combination is 70% PEEK and 30% carbon fiber.

* * * * *

UNITED STATES PATENT AND TRADEMARK OFFICE
CERTIFICATE OF CORRECTION

PATENT NO. : 6,679,194 B2
DATED : January 20, 2004
INVENTOR(S) : Dong-Seok Ham et al.

It is certified that error appears in the above-identified patent and that said Letters Patent is hereby corrected as shown below:

Title page,
Item [75], Inventors, please change "Hyeogi-Ki Kim" to -- Hyeog-Ki Kim --.
Item [*] Notice, please change "0 days" to -- 18 days --.

Signed and Sealed this

Seventh Day of June, 2005

JON W. DUDAS
*Director of the United States Patent and Trademark Office*